United States Patent
Wang et al.

(10) Patent No.: US 6,341,366 B1
(45) Date of Patent: Jan. 22, 2002

(54) RULE-DRIVEN METHOD AND SYSTEM FOR EDITING PHYSICAL INTEGRATED CIRCUIT LAYOUTS

(75) Inventors: Jui-Chien Wang; Yih-Lang Li, both of Hsinchu (TW)

(73) Assignee: Spring Soft Inc., Hsinchu (TW)

( * ) Notice: Subject to any disclaimer, the term of this patent is extended or adjusted under 35 U.S.C. 154(b) by 0 days.

(21) Appl. No.: 09/232,467

(22) Filed: Jan. 15, 1999

(51) Int. Cl.$^7$ ................................................. A61F 2/02
(52) U.S. Cl. ......................................... 716/11; 716/11
(58) Field of Search ........................................... 716/11

(56) References Cited

U.S. PATENT DOCUMENTS

| | | | | |
|---|---|---|---|---|
| 4,510,616 A | * | 4/1985 | Lougheed et al. | 382/8 |
| 5,062,054 A | * | 10/1991 | Kawakami et al. | 716/11 |
| 5,576,979 A | * | 11/1996 | Lewis et al. | 716/6 |
| 5,604,680 A | | 2/1997 | Bamji et al. | |
| 5,625,564 A | | 4/1997 | Rogoyski | |
| 5,625,568 A | * | 4/1997 | Edwards et al. | 716/2 |
| 5,768,479 A | | 6/1998 | Gadelkarim et al. | |
| 6,009,251 A | * | 12/1999 | Ho et al. | 305/500.06 |
| 6,045,584 A | * | 4/2000 | Benzel et al. | 716/11 |
| 6,049,340 A | * | 4/2000 | Matsushita et al. | 345/441 |
| 6,063,132 A | * | 5/2000 | DeCamp et al. | 716/5 |
| 6,078,737 A | * | 6/2000 | Suzuki | 395/500.2 |
| 6,115,546 A | * | 9/2000 | Chevallier et al. | 395/500.06 |
| 6,128,767 A | * | 10/2000 | Chapman | 716/1 |
| 6,189,132 B1 | * | 2/2001 | Heng et al. | 716/11 |

OTHER PUBLICATIONS

N. Hedenstierna et al., The Halo Algorithm–An Algorithm for Hierarchical Design of Rule Checking of VLSI Circuits, IEEE Transactions of CAD, col. 12, No. 2, Feb. 1993, pp. 265–272.*

G. Suzuki, A Practical Online Design Rule Checking System, ACM/IEEE Design Automation Conference, pp. 246–252.*

N. Hedenstierna et al., A Parallel Hierarchical Design Rule Checker, 1992 IEEE, pp. 142–146.*

* cited by examiner

Primary Examiner—Matthew S Smith
Assistant Examiner—A. M. Thompson
(74) Attorney, Agent, or Firm—Merchant & Gould P.C.

(57) ABSTRACT

In a rule-driven method and system for editing a physical integrated circuit layout formed from a plurality of working shapes, a desired one of the working shapes is initially created on a computer monitor. After calculating a width value associated with the desired one of the working shapes, the width value is verified to determine if it violates a minimum distance as defined by relevant design rules of an applied fabrication technology. Automatic adjustment of the geometry of the desired one of the working shapes to comply with the relevant design rules is subsequently performed upon verification that the width value violates the minimum distance.

15 Claims, 10 Drawing Sheets

RULE-DRIVEN METHOD AND SYSTEM FOR EDITING PHYSICAL INTEGRATED CIRCUIT LAYOUTS

BACKGROUND OF THE INVENTION

1. Field of the Invention

The invention relates to the editing of physical integrated circuit layouts, more particularly to a rule-driven method and system for editing physical integrated circuit layouts.

2. Description of the Related Art

With the reduction in hardware cost and substantial advances in very large scale integrated circuit (VLSI) technology, integrated circuit products have become available for widespread use. In the meantime, the soaring complexity of VLSI design follows continuous progress in the fabrication process, which still tracks the claim of Moore's Law that the memory size should double every eighteen months.

An overview of a typical full-custom integrated circuit design process is shown in FIG. 1. As illustrated, the design process can be divided into front-end and back-end design phases. The front-end design phase includes circuit design and circuit simulation. The back-end design phase includes layout design, layout verification and layout simulation. As the integrated circuit industry moves towards deep submicron technology and the wiring delays keep on increasing, the relationship between the two design phases grows much closer, and the entire design cycle may be lengthened due to more iterations in the two design phases.

The present invention puts focus on the reduction of the back-end design phase cycle. As shown in FIG. 1, the back-end design phase cycle depends mainly on layout design and layout verification. Design rule checking (DRC) is an important step in layout verification, which verifies the constraints, if existing, in one layer or between any two layers, in a physical integrated circuit layout. Traditionally, layout engineers have no idea about the distance between two working shapes of the circuit layout unless manual measurement is performed, which will interrupt layout editing. While layout editor tools provide layout engineers with manual measurement to achieve a desired distance between two working shapes whose spacing is constrained by the design rules, manual measurement as such is often inaccurate and time-consuming. Some negligence, such as incorrect distance due to inaccurate manual measurement and the use of incorrect design rules, may be left unnoticed until entering the layout verification stage, thereby resulting in the need to perform one or more design iterations. The duration of the design iteration process may range from hours to days. Moreover, fabrication technology is upgraded year by year, and layout engineers need to comply with the design rules, which are dependent upon the fabrication technology, during the layout design cycle. There is thus a problem in that layout engineers need to get familiar with design rules corresponding to a new fabrication technology within a short period of time. Also, it is easy for layout engineers to confuse the design rules of the new fabrication technology with those of older ones. Practice and training often cost much time that further prolong the design cycle.

In summary, conventional layout tools require layout engineers to manually measure the distance of two edges, between which there exists a spacing constraint. Manual measurement bothers layout engineers and may result in poor accuracy. Also, having no idea about whether the circuit layout violates some design rules during layout editing will likely lead to failure during the verification stage. Therefore, accurate and convenient distance measurement that takes into account the design rules of the applied fabrication technology without retentive faculty is thus needed to reduce much of the overload of layout engineers and shorten the back-end design phase cycle.

Patents related to circuit layouts include U.S. Pat. Nos. 5,604,680, 5,625,564 and 5,768,479. In U.S. Pat. No. 5,604,680, there is disclosed a method and system for the symbolic design of an integrated circuit layout using only topological features of cells in the layout, absent geometrical information. In U.S. Pat. No. 5,625,564, there is disclosed a method and system for extracting devices from a hierarchical cell design. In U.S. Pat. No. 5,768,479, there is disclosed an automatic physical layout placement technique whereby, according to a specified template, corresponding positions among circuit elements in the template or certain specified layout patterns can be preserved as much as possible when the original design is implemented using new fabrication technology or when minor modifications are made to the original design. In this patent, fuzzy logic is employed to evaluate the positioning cost of circuit elements for both the new physical layout and the specified template and to determine the located positions that meet maximum similarity. The processing unit is a circuit element that has meaningful functionality for electronic behavior. This patent is concerned with the relative positioning of the circuit elements. The object of this patent is to keep the positioning similarity among the circuit elements of the physical layout and the schematic layout in order to enable the layout designer to accurately control circuit parameters, such as cross talk and parasitic components. Positioning preservation is a necessity for certain parasitic-sensitive circuits, such as analog circuits and some application specific circuits.

Unlike the aforesaid patents, the present invention focuses on real-time detection of design rule violations, and can adjust the geometry of working shapes such that no unintentional design rule violations occur when layout designers edit the physical integrated circuit layout. The units processed in the present invention are the edges or corners of multi-edged working shapes. This is in contrast with a circuit element, which consists of working shapes in different layers. The present invention is not only concerned with the issue of providing layout designers with a real-time quick reference to design rule violation status among the selected boundaries of target working shapes and the boundaries of neighboring working shapes, but is also concerned with the issue of aiding designers during the editing stage by automatically rebounding the selected boundaries of target working shapes to appropriate positions such that no design rule violations occur.

SUMMARY OF THE INVENTION

Therefore, the main object of the present invention is to provide a rule-driven method and system for editing physical integrated circuit layouts, wherein major design rule violations are detected and are resolved in advance of the verification stage so that the number of design iterations (i.e. editing and verification) can be reduced in order to shorten the entire design cycle.

Another object of the present invention is to provide a rule-driven layout editing method and system that utilizes a fabrication technology file which can be upgraded in order to allow layout engineers to adapt quickly when applying new fabrication technology.

According to one aspect of the present invention, a rule-driven method for editing a physical integrated circuit layout comprised of a plurality of multi-edged working shapes, comprises the machine executed steps of:

creating a desired one of the working shapes that is shown on a computer monitor;

calculating a width value associated with the desired one of the working shapes;

verifying if the width value violates a minimum distance as defined by relevant design rules of an applied fabrication technology, including the steps of extracting the relevant design rules from a fabrication technology file, and comparing the width value with the relevant design rules; and automatically adjusting geometry of the desired one of the working shapes to comply with the relevant design rules upon verification that the width value violates the minimum distance.

According to another aspect of the present invention, a rule-driven system for the automated editing of a physical integrated circuit layout that is comprised of a plurality of multi-edged working shapes, comprises:

a monitor for showing the physical integrated circuit layout thereon;

a shape creator connected to the monitor and operable so as to create a desired one of the working shapes that is shown on the monitor;

a width calculator, connected to the shape creator, for calculating a width value associated with the desired one of the working shapes;

a width verifier, connected to the width calculator, for verifying if the width value violates a minimum distance as defined by relevant design rules of an applied fabrication technology; and a shape rebounder, connected to the shape creator and the width verifier, for controlling the shape creator to automatically adjust geometry of the desired one of the working shapes that was created using the shape creator to comply with the relevant design rules upon verification by the width verifier that the width value violates the minimum distance.

The rule-driven layout editing method and system of the present invention can avoid the aforesaid problems in the prior art and reduce the back-end design phase cycle. During the layout editing process, the editing of working shapes, including shape creation and reshaping of working shapes, is an important step that is frequently encountered. When the design rule criteria are met in this step, the physical integrated circuit layout can easily pass the verification stage. Unlike conventional layout tools, when layout engineers edit working shapes, the rule-driven layout editing method and system of the present invention automatically tips all necessary distances to obviate the need for layout engineers to perform manual distance measurement if the system is operated in the rule-driven editing mode. Automatic distance prompt can allow the editing process to proceed smoothly, as well as improve the design accuracy.

When layout engineers start to edit working shapes, the rule-driven layout editing method and system of the present invention begins to monitor the whole editing process to determine if the system is operated in the rule-driven editing mode. Whenever the layout engineer moves a user input device, such as a mouse, in the rule-driven editing mode, the system will retrieve the design rules that are associated with the working shapes from a fabrication technology file, which is stored in an electronic data storage medium, to check if current movement will lead to a design rule violation. If such a violation occurs, the system will automatically fix the violation by forcing the edges of the working shapes to the appropriate positions so that design rule violations no longer occur, and will optionally draw a ruler between those two edges whose initial distance violates the design rules. The edges in question may also be highlighted to alert the layout engineer. If the target working shape has more than two constraints between itself and its neighboring working shapes, the system will adopt the maximum value. If layout engineers wish to generate layouts using different fabrication technologies, the only thing required in the method and system of the present invention is to upgrade the fabrication technology file. Under the method and system of the present invention, those edges having design rule violations will be automatically corrected, and a ruler with a tip that displays the new design rules extracted from the new technology file can be subsequently and optionally shown. Via these convenient and intelligent processes, the back-end design phase cycle can be considerably shortened.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
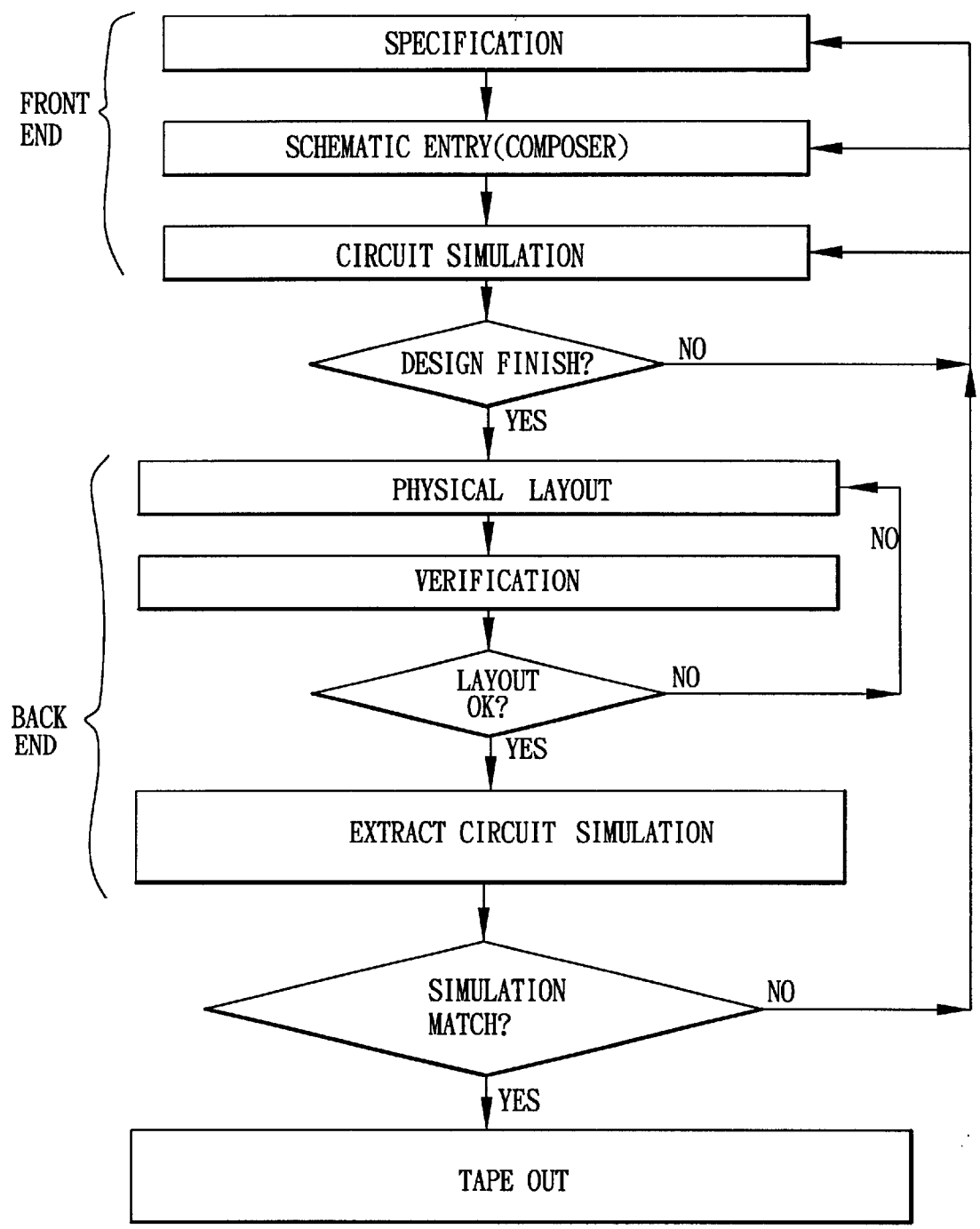
FIG. 1 is a flowchart illustrating an overview of a typical full-custom integrated circuit design process.
Figure 2:
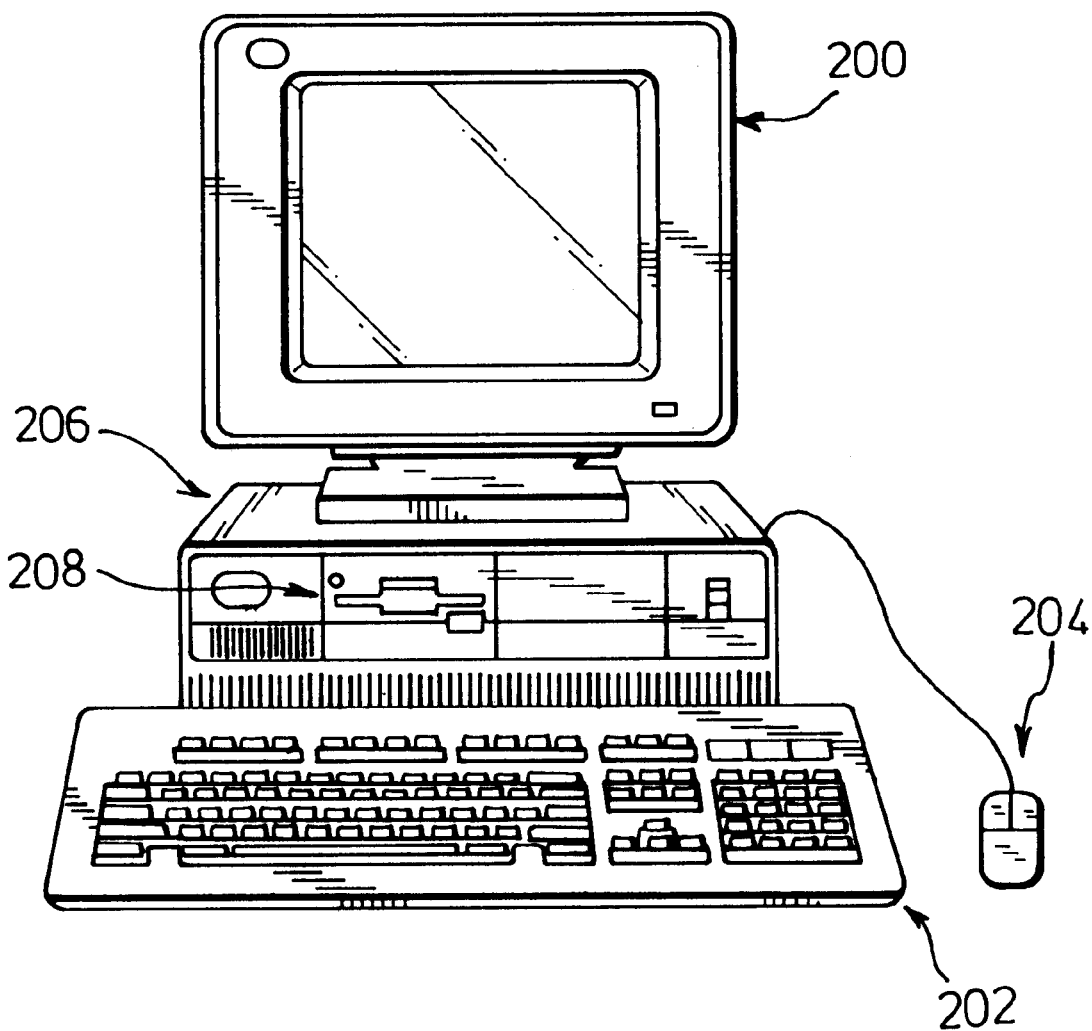
FIG. 2 illustrates an exemplary CAD workstation where the rule-driven layout editing method and system of the present invention resides.

The method of the present invention is implemented within a CAD environment, and typically resides on an electronic data storage medium inside a computer workstation. FIG. 2 shows a typical computer workstation dedicated to VLSI CAD tasks. The computer workstation houses various CAD tools ranging from synthesis and circuit simulation to layout design tools, and comprises a monitor 200, a keyboard 202, a mouse 204, which serves as a user input device, and a cabinet 206. There are many components on the cabinet 206, such as a floppy disk drive 208, a CD-ROM drive, a hard disk drive, processors, and memory and network devices (not shown). CAD tools, in which the method of the present invention is incorporated, can be stored in and retrieved from among the different storage devices during use.

Figure 11:
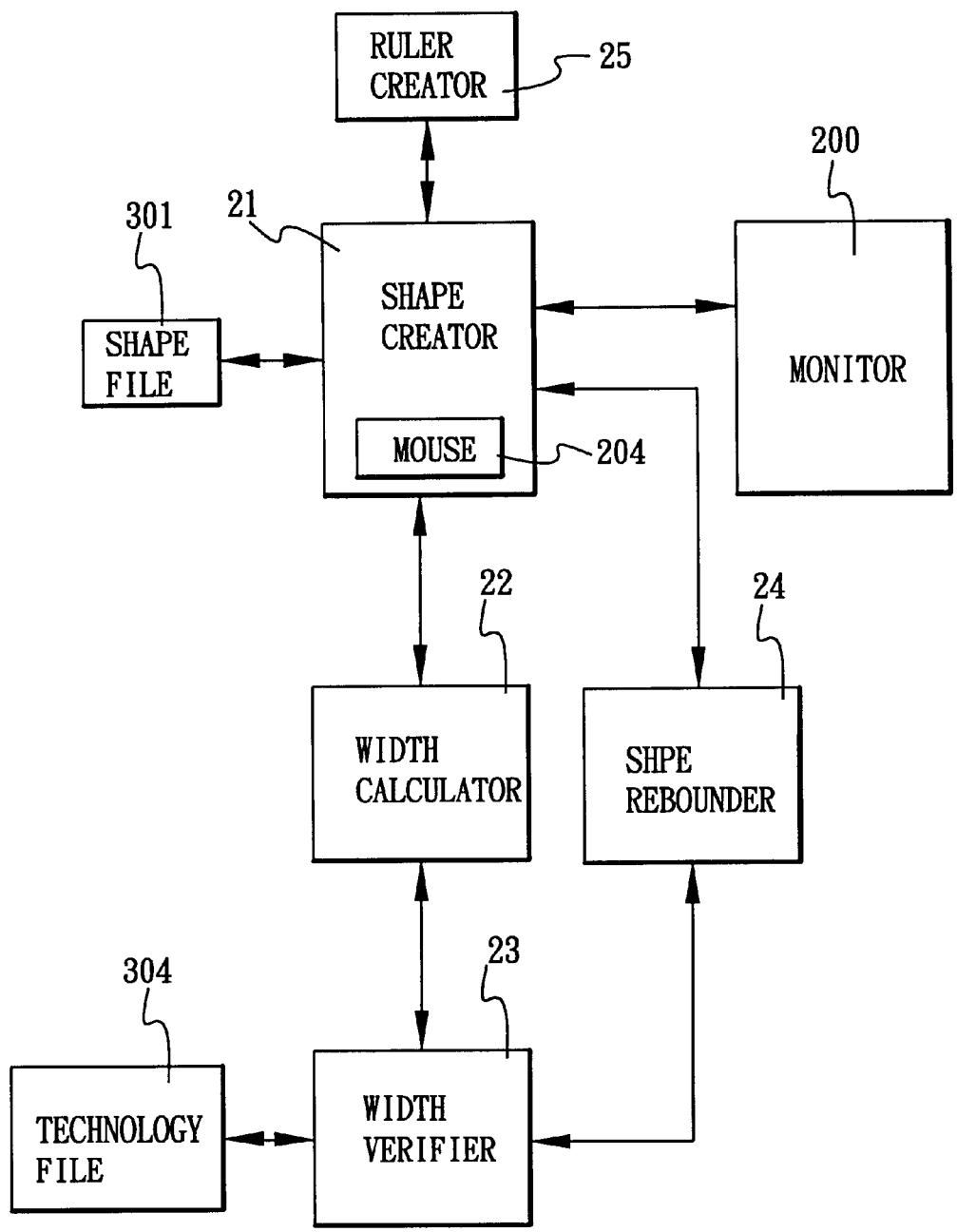
FIG. 11 is a block diagram of the rule-driven layout editing system of the preferred embodiment.

Referring to FIG. 11, when the computer workstation of FIG. 2 implements the method of the present invention, the processing system thereof will be configured to include a shape creator 21, a width calculator 22, a width verifier 23, a shape rebounder 24, and a ruler creator 25, the purposes of which will be described in greater detail in the succeeding paragraphs.

Figure 3:
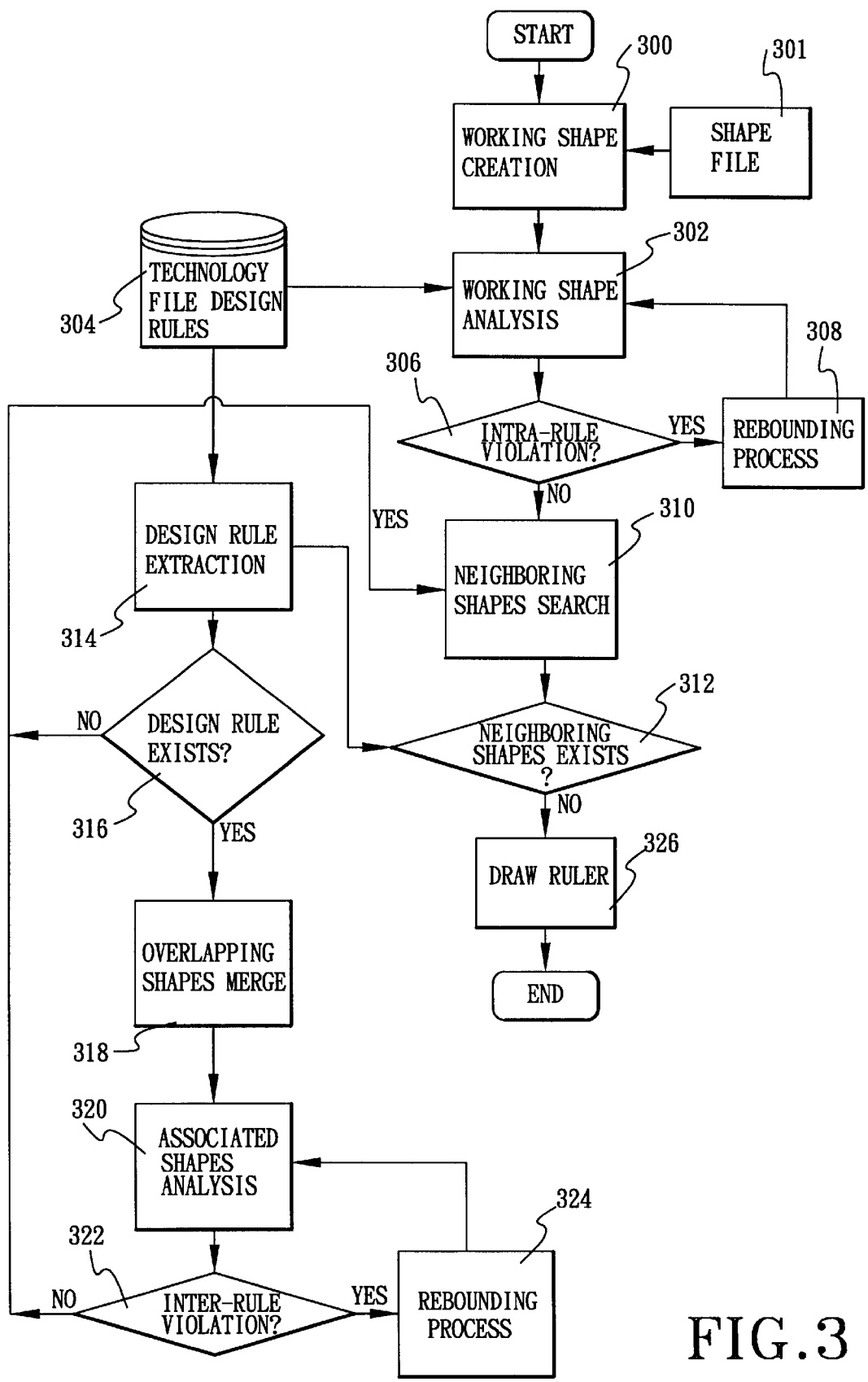
FIG. 3 is a flow diagram illustrating the preferred embodiment of a rule-driven layout editing method and system of the present invention.

FIG. 3 is a flow diagram illustrating the preferred embodiment of the rule-driven layout editing method of the present invention. The method begins with the creation of working shapes at step 300, in which one shape or a group of shapes are created, such as with the use of a shape file 301, and in which shape modification is done in a known manner. The output of the working shape creation routine, namely the working shapes that will undergo the editing process as will be described hereinafter, serves as the input to step 302. Step 302 involves analysis of the working shapes. In this step, the distance between a selected edge of the working shape and a facing edge of the working shape opposite to the selected edge is calculated. This distance is referred to as a width of the working shape. In step 302, the width rules for the working shape layer are also extracted from a fabrication technology file 304, which is stored in an electronic data storage medium. Different fabrication processes have their own specific requirements. The fabrication technology file 304 contains design rules that define many constraints to meet the criteria of a particular fabrication process. In step 306, a width-checking operation is performed to compare the calculated width value with the relevant width rules from the fabrication technology file 304 in order to determine if intra-rule violation has occurred. If a width rule violation is detected, the flow proceeds to step 308, where a rebounding process is performed to correct the violation. The rebounding process of step 308 rebounds a selected edge of the working shape to an appropriate position called the rebounding spot so that the calculated width value of the working shape will comply with the relevant width rules from the fabrication technology file 304. The rebounding process of step 308 will be described in greater detail in the succeeding paragraphs with reference to FIG. 4.

If no width rule violation is detected in step 306, the flow proceeds to step 310, where a search for neighboring working shapes proximate to the target working shape on the physical integrated circuit layout is performed. Another type of design rule checking to determine the presence of inter-rule violation starts from this step. This type of design rule checking involves external-distance checking, enclosure-distance checking, extension-distance checking and overlapping-distance checking to determine the presence of inter-rule violation. In step 306, the search for other working shapes in any layer, including the current working shape layer, that are in the neighborhood of the target working shape proceeds. If it is determined in step 312 that no neighboring working shape exists, the flow proceeds to step 326, where a ruler will be drawn between every pair of oppositely facing edges of the target working shape. The method is terminated at this time.

If it is determined in step 312 that a neighboring working shape indeed exists, the flow proceeds to step 314, where associated design rules for external-distance checking, enclosure-distance checking, extension-distance checking and overlapping-distance checking, which define the minimum distances or widths between the edges of the target working shape and the facing edges of the neighboring working shape, are extracted from the fabrication technology file 304. Thereafter, in step 316, it is determined if design rules for the target working shape and a current neighboring working shape actually exist. Failure in the design rule extraction indicates that there is no predefined spacing constraint between the target working shape and the current neighboring working shape, and the flow subsequently goes back to step 310 to find the presence of another neighboring working shape.

If it is determined in step 316 that design rules for the target working shape and the current neighboring working shape actually exist, the flow proceeds to step 318, where the current neighboring working shape is merged with a previous neighboring working shape, if any, should the former overlap with the latter. In the example shown in FIG. 6, the target working shape 400 is proximate to neighboring working shapes (A1), (A2) that overlap each other. After step 318, the neighboring working shapes (A1), (A2) will be merged to form a compound neighboring working shape (A) with respect to the target working shape 400, as illustrated in FIG. 7.

Inter-rule violation checking is subsequently performed in a loop that includes associated shape analysis at step 320, inter-rule violation verification at step 322, and a rebounding process at step 324 until inter-rule violation no longer occurs, upon which the flow goes back to step 310. The inter-rule violation procedure will be described in greater detail hereinafter with reference to FIGS. 5 to 10.

The rebounding process associated with the different design rule checking operations, namely width checking, external-distance checking, enclosure-distance checking, extension-distance checking and overlapping-distance checking, will now be described in the following paragraphs. Referring again to FIG. 11, during shape creation, which includes shape modification with the use of the mouse 204, the editing process can either be edge-oriented or corner-oriented. In the edge-oriented editing process, the mouse 204 is operated to focus on the selected edge of the target working shape that is shown on the monitor 200, and to move the selected edge so as to alter the geometry of the target working shape. Thus, the geometry of the target working shape is altered in a single dimension. In the corner-oriented editing process, the mouse 204 is operated to focus on the selected corner of the target working shape, and to move the selected corner and in turn move edges of the working shape adjacent to the selected corner to thereby alter the geometry of the working shape. Unlike the edge-oriented editing process, the geometry of the working shape is altered in two-dimensions. In the method and system of the present invention, the working shape is multi-edged and can be Manhattan polygons or non-Manhattan polygons. Manhattan polygons differ from non-Manhattan polygons in the angles formed by adjacent boundaries. The boundaries of Manhattan polygons only include right angles, while those of non-Manhattan polygons can include acute or obtuse angles.

Figure 4:
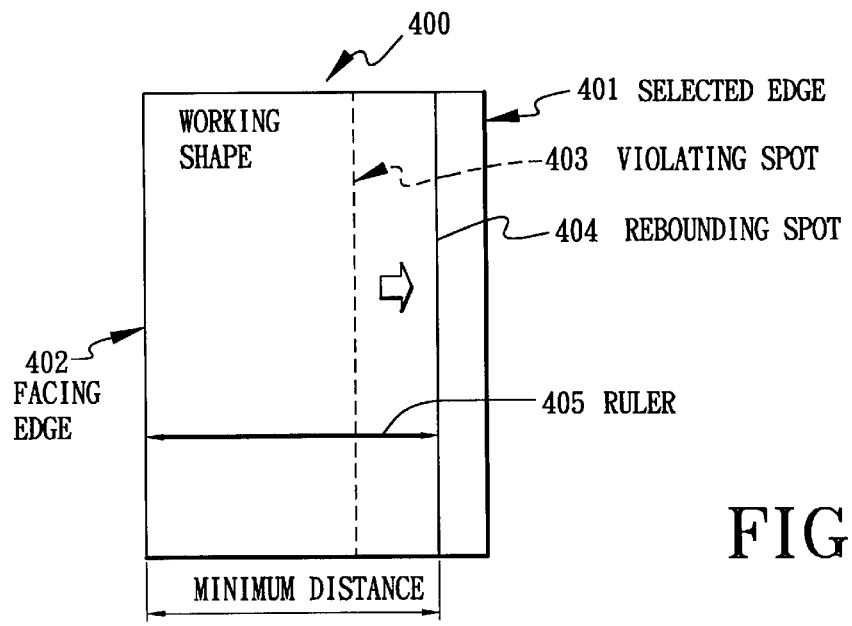
FIG. 4 illustrates a width-checking operation of the preferred embodiment.

Referring to FIGS. 11 and 4, the latter being an example to illustrate the width-checking operation of the preferred embodiment, the working shape 400 of FIG. 4 is a rectangle that is created with the use of the shape creator 21 and that is shown on the monitor 200. In this example, the layout engineer wishes to modify the working shape 400 by moving the right edge, which is the selected edge 401, toward the left edge, which is the facing edge 402. There exists a predefined minimum distance or width between the selected and facing edges 401, 402 of the working shape 400 that depends on the applied fabrication technology and that is stored in the fabrication technology file 304. The width calculator 22 is connected to the shape creator 21 and calculates the distance between the edges 401, 402, which serves as a width value of the working shape 400. When the selected edge 401 is moved with the use of the mouse 204 toward the facing edge 402 to a violating spot 403 indicated in dotted lines such that the new distance between the edges 401, 402 is smaller than the minimum distance, this violation will be detected by the width verifier 23, which compares the width value from the width calculator 22 with the relevant design rules extracted from the fabrication technology file 304. The shape rebounder 24, which is connected to the width calculator 22 and the shape creator 21, will then force the shape creator 21 to rebound the selected edge to a rebounding spot 404 which is displaced by the minimum distance from the facing edge 401. In the meantime, the ruler creator 25 controls the shape creator 21 to generate a ruler 405 on the monitor 200 between the edges whose width is being checked. If the working shape is a polygon having more than four edges, the system of the present invention will verify all widths between the selected edges and the non-adjacent facing edges.

Figure 5:
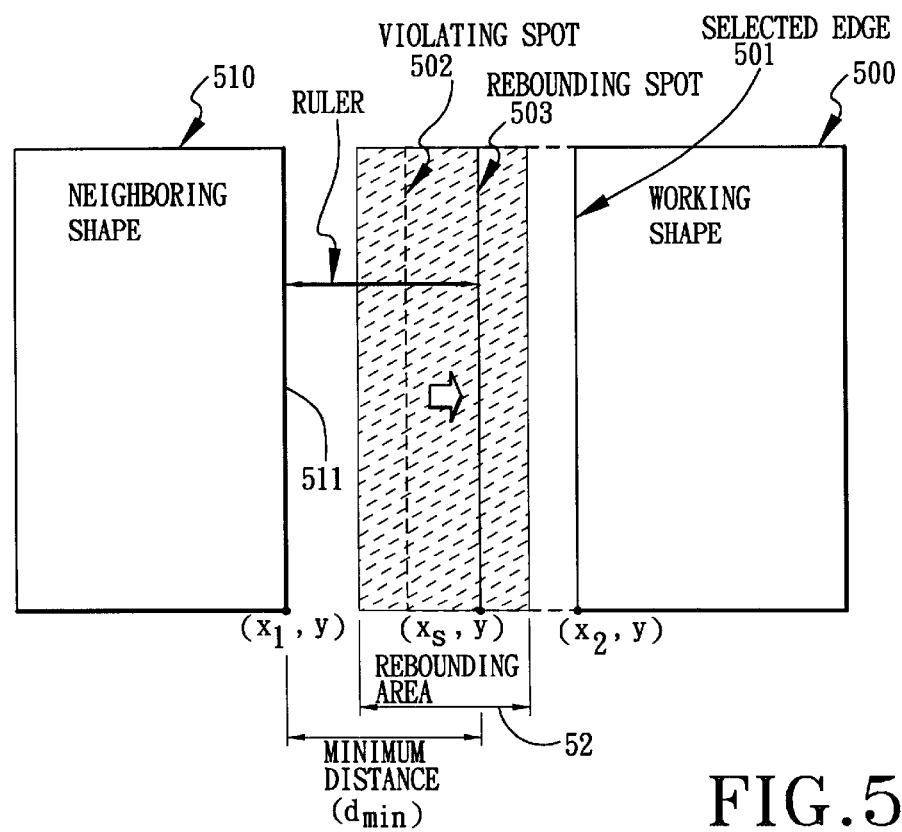
FIG. 5 illustrates an edge-oriented external distance-checking operation of the preferred embodiment.

FIG. 5 is an example to illustrate the edge-oriented external distance-checking operation of the preferred embodiment. The concept of external-distance checking is generally similar to that of the width-checking operation described beforehand. However, during external-distance checking, it is the distance between adjacent edges of a working shape 500 and a neighboring working shape 510 proximate to the working shape 500 on the physical integrated circuit layout which is verified. Moreover, the concept of a rebounding area is introduced during external-distance checking. As illustrated, the distance between the selected edge 501 of the working shape 500 and the facing edge 511 of the neighboring working shape 510 is $x_2-x_1$. $d_{min}$ is the minimum distance between the edges 501, 511 as defined in the applied fabrication technology. The coordinates of the rebounding spot are $(x_s, y)$. The minimum distance $d_{min}$ is thus equal to $x_s-x_1$. The rebounding area 52, which is illustrated in the form of a shaded region, is defined by the following equations:

$$x_l = x_s - \alpha * d_{min}, \ 0 \leq \alpha \leq 1; \quad (1)$$

$$x_r = x_s + \beta * d_{min}, \ 0 \leq \beta \leq 1; \quad (2)$$

Once the layout engineer moves the selected edge 501 toward the facing edge 511 into the rebounding area 52 with the use of the mouse 204 (see FIG. 11), such as at violating spot 502, the shape rebounder 24 (see FIG. 11) will operate to control automatic rebounding of the selected edge to the rebounding spot 503. The present invention allows layout engineers to control the parameters $\alpha$ and $\beta$, which range from 0 to 1, to vary the width of the rebounding area 52. Extreme values of the parameters $\alpha$ and $\beta$ have special meanings. For example, when the two parameters $\alpha$ and $\beta$ are equal to 0, the rebounding area 52 no longer exists, and no rebounding operation will take place. Accordingly, when the two parameters $\alpha$ and $\beta$ are equal to 1, any movement of the selected edge 501 that will result in a distance less than the minimum distance $d_{min}$ will not be permitted.

Equations (1) and (2) define the rebounding area 52 for left or right movement of the selected edge of the working shape. The equations that define the rebounding area in case of upward or downward movement of the selected edge of the working shape are as follows:

$$y_u = y_s + \alpha * d_{min}, \ 0 \leq \alpha \leq 1; \quad (3)$$

$$y_d = y_s - \beta * d_{min}, \ 0 \leq \beta \leq 1; \quad (4)$$

Figure 6:
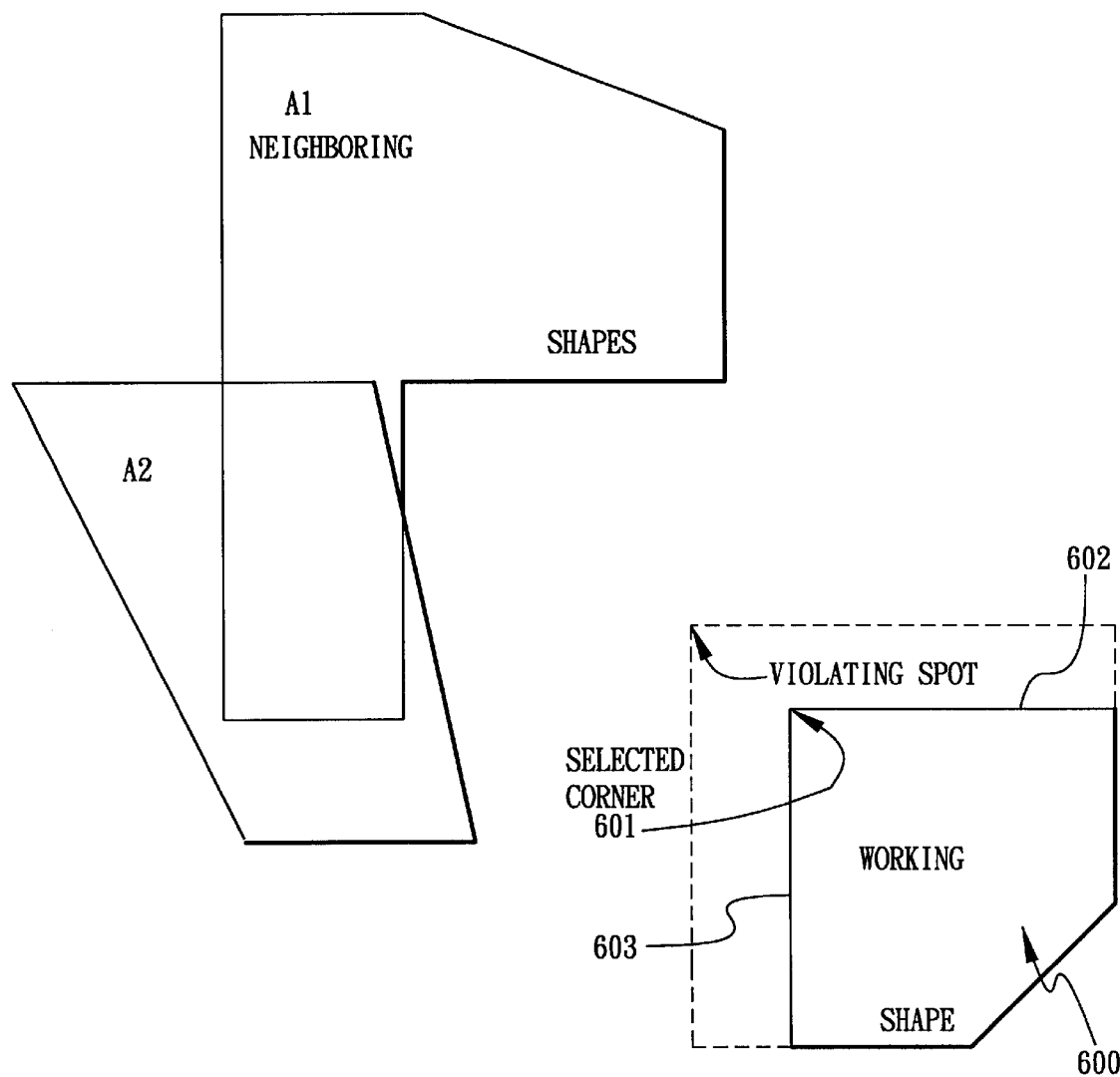
FIG. 6 illustrates a corner-oriented external distance-checking operation of the preferred embodiment.
Figure 7:
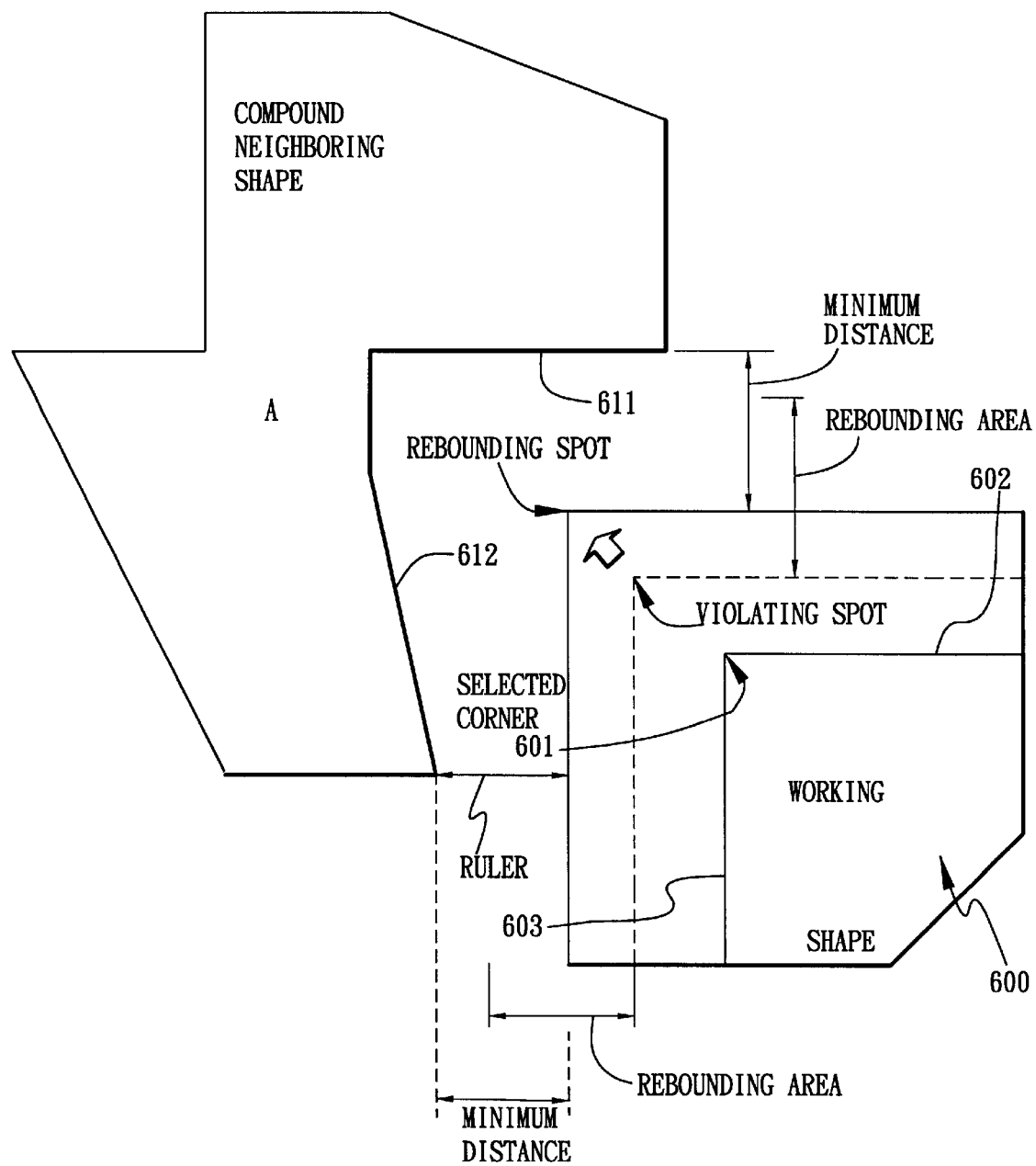
FIG. 7 illustrates how overlapping neighboring working shapes are merged during the corner-oriented external distance-checking operation of FIG. 6.

FIGS. 6 and 7 illustrate an example of a corner-oriented external distance-checking operation of the preferred embodiment. As mentioned beforehand, the overlapping neighboring working shapes (A1) and (A2) of FIG. 6 are merged to obtain the compound neighboring working shape (A) of FIG. 7 during the external distance-checking operation. The corner-oriented external distance-checking operation is more complicated than the edge-oriented external distance-checking operation because moving a selected corner 601 of the working shape 600 will result in corresponding movement of adjacent edges 602, 603 of the working shape 600. There is thus a need to verify whether the new distances between the edges 602, 603 of the working shape 600 and the facing edges 611, 612 of the compound neighboring working shape (A) due to movement of the edges 602, 603 will violate the minimum distance rules that depend on the applied fabrication technology. The processes of verifying the new distances and correcting the design rule violations are generally similar to those described in the example of FIG. 5 and will not be detailed further.

Figure 8:
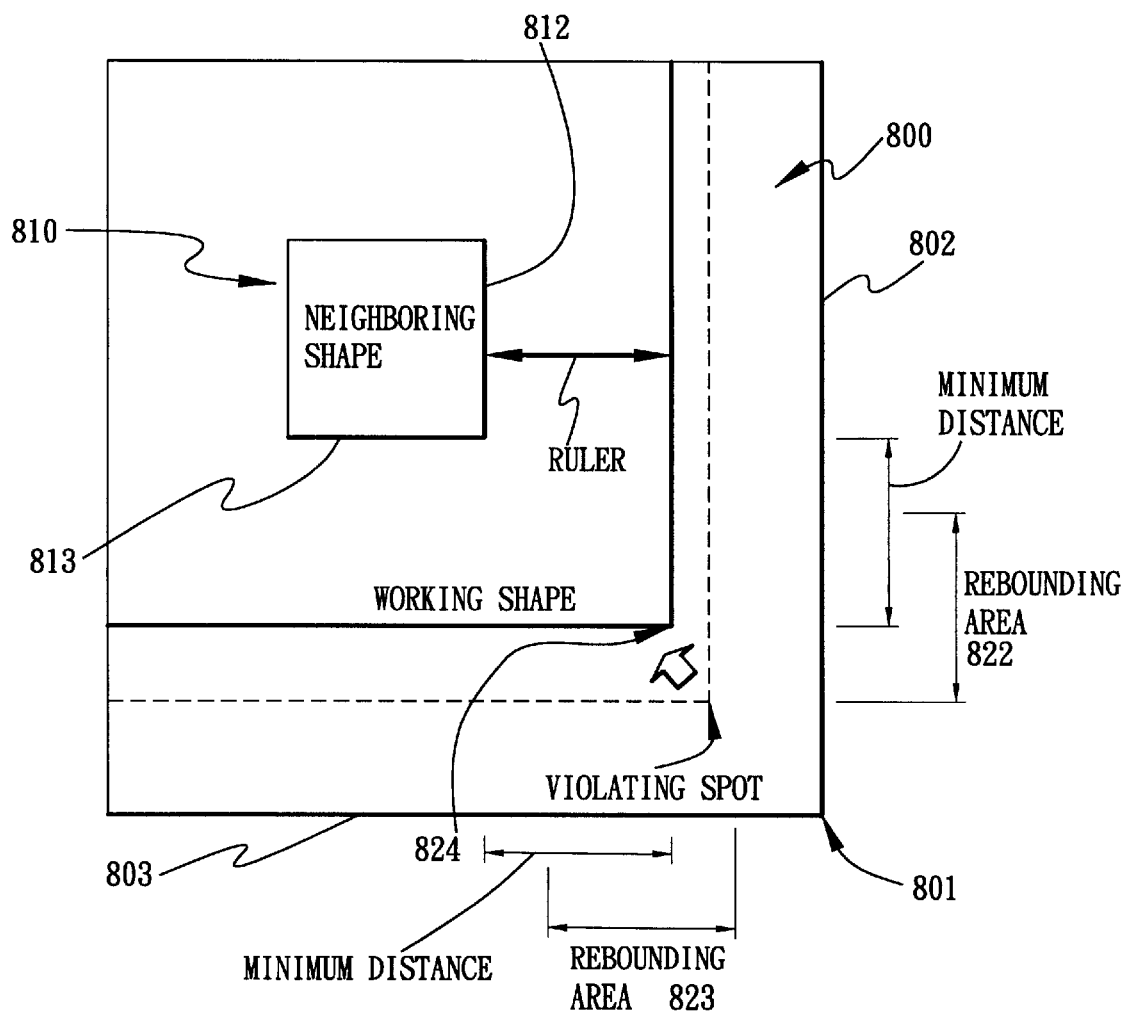
FIG. 8 illustrates an enclosure distance-checking operation of the preferred embodiment.

FIG. 8 is an example to illustrate the enclosure distance-checking operation of the preferred embodiment. The concept of enclosure-distance checking is generally similar to that of the external distance-checking operation described beforehand. However, during enclosure-distance checking, it is the distances from adjacent edges 802, 803 of a working shape 800 to corresponding facing edges 812, 813 of a neighboring working shape 810 that is enclosed by the working shape 800 which are verified. Enclosure-distance checking ensures that the distances from the adjacent edges 802, 803 to the corresponding facing edges 812, 813 do not violate minimum distances as defined in the applied fabrication technology, such as the relationship between a contact layer and a metal layer. The example of FIG. 8 is also corner-oriented, wherein movement of a selected corner 801 of the working shape 800 results in corresponding movement of the adjacent edges 802, 803. Like the previous examples, when movement of the selected corner 801 results in entry of any one of the adjacent edges 802, 803 into a corresponding rebounding area 822, 823, a rebounding operation will be performed to rebound the selected corner 801 to a rebounding spot 824.

Figure 9:
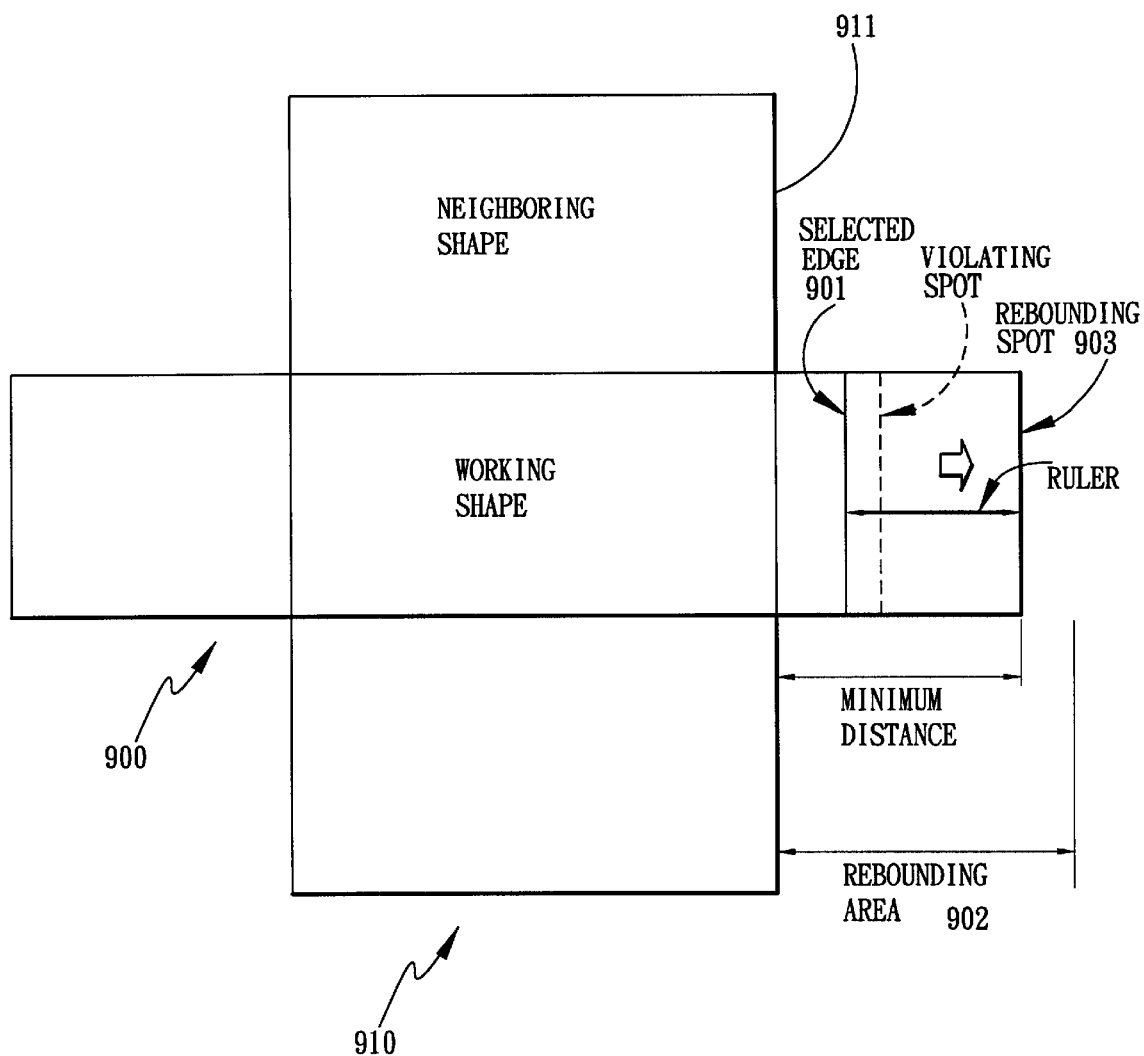
FIG. 9 illustrates an extension distance-checking operation of the preferred embodiment.

FIG. 9 is an example to illustrate the extension distance-checking operation of the preferred embodiment. The concept of extension-distance checking is generally similar to the various distance-checking operations described beforehand. However, during extension-distance checking, it is the distance by which a selected edge 901 of a working shape 900 extends outside from a corresponding facing edge 911 of an underlying or overlying neighboring shape 910 which is verified. Extension-distance checking ensures that this distance does not violate the minimum distance as defined in the applied fabrication technology. The example of FIG. 9 is edge-oriented. When the selected edge 901 is moved into the corresponding rebounding area 902, a rebounding operation will be performed in the manner of the previous examples to rebound the selected edge 901 to a rebounding spot 903 automatically.

Figure 10:
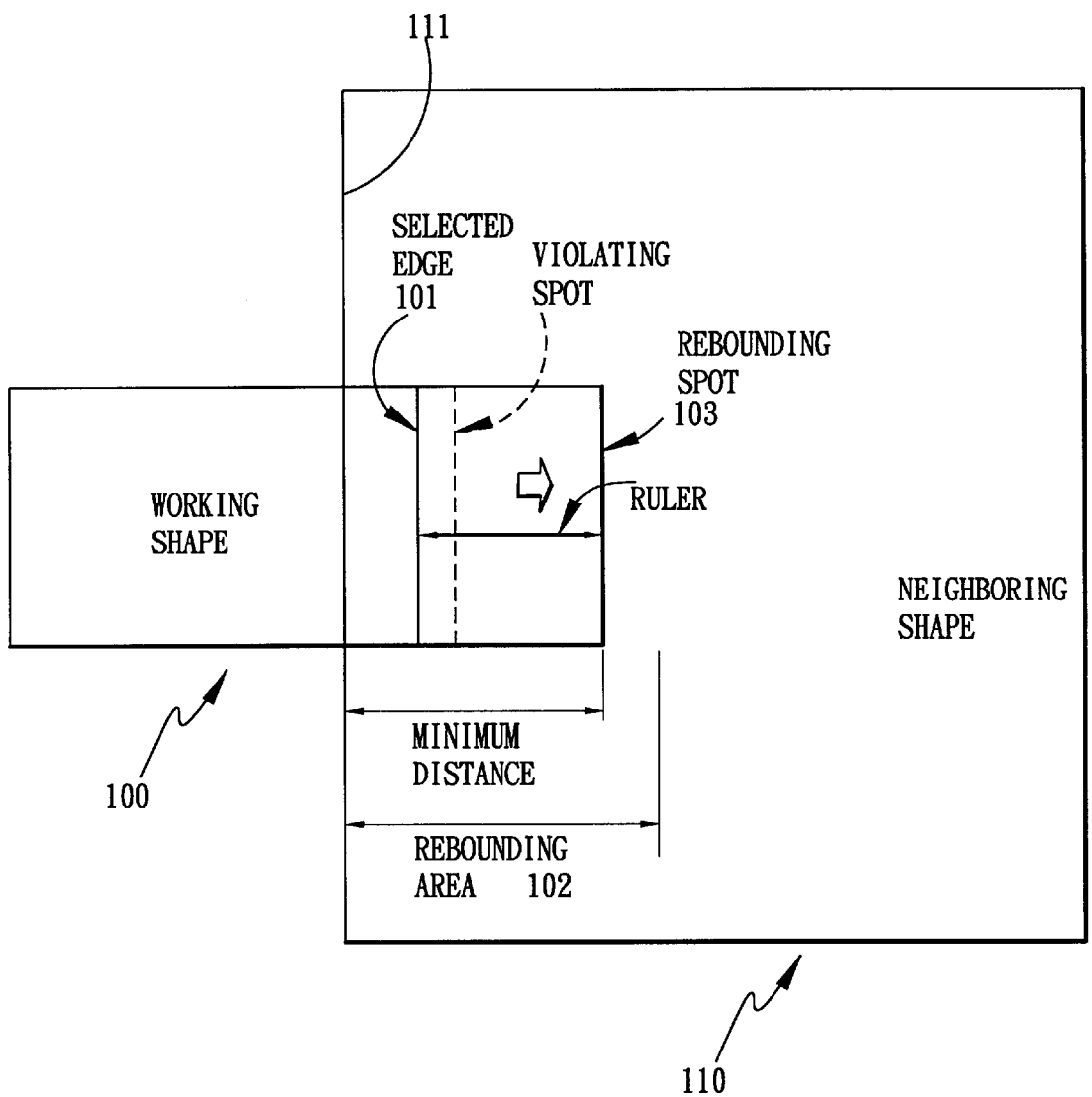
FIG. 10 illustrates an overlapping distance-checking operation of the preferred embodiment.

FIG. 10 is an example to illustrate the overlapping distance-checking operation of the preferred embodiment. The concept of overlapping-distance checking is analogous to that of extension-distance checking. Unlike extension-distance checking, overlapping-distance checking involves the verification of the distance by which a selected edge 101 of a working shape 100 extends inside beyond a corresponding facing edge 111 of an underlying or overlying neighboring shape 110 to ensure that this distance does not violate the minimum distance as defined in the applied fabrication technology. The example of FIG. 10 is also edge-oriented. When the selected edge 101 is moved into the corresponding rebounding area 102, a rebounding operation will be performed in the manner of the previous examples to rebound the selected edge 101 to a rebounding spot 103 automatically.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A rule-driven method for editing a physical integrated circuit layout comprised of a plurality of working shapes, comprising the machine executed steps of:

creating a desired working shape that is shown on a computer monitor;

calculating a width value associated with said desired working shape;

verifying if the width value violates a minimum distance as defined by relevant design rules of an applied fabrication technology; and automatically adjusting geometry of said desired working shape to comply with the relevant design rules upon verification that the width value violates the minimum distance;

wherein each of the working shapes is multi-edge, and the width value is the distance between a selected edge and an opposite facing edge of said desired working shape;

wherein the step of automatically adjusting the geometry of said desired working shape includes the sub-step of rebounding the selected edge to a rebounding spot that is displaced by the minimum distance from the opposite facing edge; and further comprising the step of creating a ruler that is disposed between the selected edge and the opposite facing edge and that is shown on the computer monitor.

2. A rule-driven method for editing a physical integrated circuit layout comprised of a plurality of working shapes, comprising the machine executed steps of:

creating a desired working shape that is shown on a computer monitor;

calculating a width value associated with said desired working shape;

verifying if the width value violates a minimum distance as defined by relevant design rules of an applied fabrication technology; and automatically adjusting geometry of said desired working shape to comply with the relevant design rules upon verification that the width value violates the minimum distance;

wherein each of the working shapes is multi-edge, and the width value is the distance between a selected edge of said desired working shape and a facing edge of a neighboring working shape proximate to said desired working shape on the physical integrated circuit layout;

wherein the step of creating said desired working shape includes the sub-step of moving at least the selected edge of said desired working shape relative to the facing edge;

wherein the step of automatically adjusting the geometry of said desired working shape includes the sub-steps of defining a rebounding area between the selected edge of said desired working shape and the facing edge of the neighboring working shape, and rebounding the selected edge to a rebounding spot in the rebounding area that is displaced by the minimum distance from the facing edge whenever the selected edge is moved into the rebounding area during the step of creating said desired working shape; and further comprising the step of creating a ruler that is disposed between the selected edge and the facing edge and that is shown on the computer monitor.

3. A rule-driven system for the automated editing a physical integrated circuit layout that is comprised of a plurality of multi-edge working shapes, the rule-driven system comprising:

a monitor for showing the physical integrated circuit layout thereon;

a shape creator connected to said monitor and operable so as to create a desired working shape that is shown on said monitor;

a width calculator, connected to said shape creator, for calculating a width value associated with said desired working shape;

a width verifier, connected to said width calculator, for verifying if the width value violates a minimum distance as defined by relevant design rules of an applied fabrication technology; and a shape rebounder, connected to said shape creator and said width verifier, for controlling said shape creator to automatically adjust geometry of said desired working shape that was created using said shape creator to comply with the relevant design rules upon verification by said width verifier that the width value violates the minimum distance.

4. The rule-driven system of claim 3, further comprising a data storage device for storing the design rules therein, said width verifier including means for extracting the relevant design rules from said data storage device, and means for comparing the width value with the relevant design rules.

5. The rule-driven system of claim 3, wherein said shape creator includes a user input device that is operable so as to modify the geometry of said desired working shape.

6. The rule-driven system of claim 3, wherein said shape creator includes a user input device that is operable so as to move a selected edge of said desired working shape.

7. The rule-driven system of claim 3, wherein said shape creator includes a user input device that is operable so as to move a selected corner of said desired working shape and to move in turn adjacent selected edges of said desired working shape.

8. The rule-driven system of claim 3, wherein the width value calculated by said width calculator is the distance between a selected edge and an opposite facing edge of said desired working shape.

9. The rule-driven system of claim 8, wherein said shape rebounder includes means for rebounding the selected edge to a rebounding spot that is displaced by the minimum distance from the opposite facing edge.

10. The rule-driven system of claim 9, further comprising a ruler creator that is connected to said shape creator so as to control generation of a ruler disposed between the selected edge and the opposite facing edge and shown on said monitor.

11. The rule-driven system of claim 3, wherein the width value calculated by said width calculator is the distance between a selected edge of said desired working shape and a facing edge of a neighboring working shape proximate to said desired working shape on the physical integrated circuit layout.

12. The rule-driven system of claim 11, wherein said shape rebounder includes means for rebounding the selected edge to a rebounding spot that is displaced by the minimum distance from the facing edge.

13. The rule-driven system of claim 11, wherein said shape creator includes a user input device that is operable so as to move at least the selected edge of said desired working shape relative to the facing edge.

14. The rule-driven system of claim 13, wherein said shape rebounder includes means for defining a rebounding area between the selected edge of said desired working shape and the facing edge of the neighboring working shape, and means for rebounding the selected edge to a rebounding spot in the rebounding area that is displaced by the minimum distance from the facing edge whenever the selected edge is moved into the rebounding area by said user input device.

15. The rule-driven system of claim 14, further comprising a ruler creator that is connected to said shape creator so as to control generation of a ruler disposed between the selected edge and the facing edge and shown on said monitor.

* * * * *